(12) United States Patent
Xu et al.

(10) Patent No.: US 10,964,763 B2
(45) Date of Patent: Mar. 30, 2021

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Pan Xu, Beijing (CN); Yicheng Lin, Beijing (CN); Ling Wang, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 16/417,105

(22) Filed: May 20, 2019

(65) Prior Publication Data
US 2020/0098839 A1 Mar. 26, 2020

(30) Foreign Application Priority Data
Sep. 26, 2018 (CN) .......................... 201811122725.2

(51) Int. Cl.
*H01L 27/32* (2006.01)
*G02B 5/22* (2006.01)
(Continued)

(52) U.S. Cl.
CPC ............ *H01L 27/3246* (2013.01); *G02B 5/22* (2013.01); *H01L 51/5221* (2013.01); *H04N 9/315* (2013.01)

(58) Field of Classification Search
CPC ............ H01L 27/3246; H01L 51/5221; H01L 2251/5323; H01L 51/5234; H01L 27/3227; H01L 51/5284; H01L 27/3269; H01L 27/3272; H01L 27/3244; H01L 2227/323; H04N 9/315; G02B 5/22
See application file for complete search history.

(56) References Cited

U.S. PATENT DOCUMENTS 8,476,826 B2 7/2013 Oohata et al.
9,252,197 B2 2/2016 Nakamura et al.
(Continued)

FOREIGN PATENT DOCUMENTS

| CN | 101847343 A | 9/2010 |
| CN | 101859714 A | 10/2010 |
| CN | 104916658 A | 9/2015 |

OTHER PUBLICATIONS

Chinese Office Action in Chinese Application No. 201811122725.2, dated May 20, 2020 with English translation.

*Primary Examiner* — Patrick N Edouard
*Assistant Examiner* — Joseph P Fox
(74) *Attorney, Agent, or Firm* — Collard & Roe, P.C.

(57) ABSTRACT

A display panel, a manufacturing method thereof and a display device are disclosed. The display panel includes a display backplane and a display cover assembled to be a cell. The display backplane includes a first base substrate, a pixel circuit layer, a first electrode layer, a light-emitting layer, a second transparent electrode layer, and a plurality of first pixel regions stacked on the first base substrate. The display cover includes a second base substrate, a plurality of optical sensing components and a plurality of second pixel regions on the second base substrate, the plurality of optical sensing components being arranged in the plurality of second pixel regions in one to one correspondence.

20 Claims, 7 Drawing Sheets

(51) Int. Cl.
*H01L 51/52* (2006.01)
*H04N 9/31* (2006.01)

(56) References Cited

U.S. PATENT DOCUMENTS

| | | | |
|---|---|---|---|
| 2007/0222370 A1* | 9/2007 | Zhu | H01L 51/5262 313/504 |
| 2010/0245216 A1* | 9/2010 | Nakamura | H01L 27/3269 345/76 |
| 2016/0225831 A1 | 8/2016 | Ito | |

* cited by examiner

DISPLAY PANEL, MANUFACTURING METHOD THEREOF, AND DISPLAY DEVICE

CROSS REFERENCE TO RELATED APPLICATIONS

The present application claims the benefits of the priority of Chinese patent application No. 201811122725.2 entitled "Display Panel, Manufacturing Method Thereof, and Display Device" and filed to CNIPA on Sep. 26, 2018, the entire text of which is incorporated herein by reference.

TECHNICAL FIELD

Embodiments of the present disclosure relate to a display panel, a manufacturing method thereof, and a display device.

BACKGROUND

An organic light-emitting diode (OLED) display panel may include an anode layer, a light-emitting layer, a cathode layer, and a pixel circuit on a base substrate. The anode layer includes an anode in each pixel region, and pixel circuits are disposed in each pixel region. The pixel circuit in each pixel region is used to provide an anode signal to the anode in the pixel region so that the light-emitting layer emits light under the control of the anode signal loaded on the anode and the cathode signal loaded on the cathode layer.

SUMMARY

Embodiments of the present disclosure provide a display panel and the manufacturing method thereof and a display device.

According to at least one embodiment of the present disclosure, a display panel is provided, comprising: a display backplane and a display cover assembled to be a cell. The display backplane comprises a plurality of first pixel regions in an array, and the display cover comprises a plurality of second pixel regions in an array, positions of the plurality of first pixel regions being correspond to positions of the plurality of second pixel regions one to one; the display backplane further comprises a first base substrate, and a pixel circuit layer, a first electrode layer, a light-emitting layer and a second transparent electrode layer stacked on the first base substrate. The pixel circuit layer comprises a plurality of pixel circuits, the first electrode layer comprises a plurality of first electrodes, the plurality of first electrodes and the plurality of pixel circuits being respectively provided in the plurality of first pixel regions in one to one correspondence, and each of the pixel circuits in the first pixel regions being configured to provide signals to the first electrodes in the first pixel regions; and the display cover further comprises a second base substrate and a plurality of optical sensing components on the second base substrate. The plurality of optical sensing components are provided in the plurality of second pixel regions in one to one correspondence, and the optical sensing components being configured to receive optical signals emitted by a light-emitting layer in each of the first pixel regions corresponding to the second pixel regions where the optical sensing components are positioned, and convert the optical signals into electrical signals, the electrical signals being used for adjusting signals input to each of the first electrodes in a corresponding first pixel region by pixel circuits in the corresponding first pixel region.

For example, the first pixel region comprises a display area and a non-display area, an orthographic projection of the display area on the second base substrate covering an orthographic projection of the optical sensing components on the second base substrate.

For example, the display cover further comprises: a switch circuit in each of the second pixel regions, and a control circuit, for each of the second pixel regions, a switch circuit in the second pixel region being configured to control whether an electrical signal from an optical sensing component in the second pixel region is input to the control circuit, the control circuit being configured to adjust a drive signal input to a pixel circuit in the first pixel region based on the electrical signal, the drive signal being used for the pixel circuit in the first pixel region to adjust a signal input to a first electrode in the first pixel region.

For example, the display cover further comprises: a first planarization layer provided on a side of the optical sensing components away from the second base substrate, an orthographic projection of the first planarization layer on the second base substrate covering an orthographic projection of the switch circuit on the second base substrate, and the orthographic projection of the first planarization layer on the second base substrate covering an orthographic projection of the optical sensing components on the second base substrate.

For example, the display cover further comprises a black matrix configured to block light emitted from the light-emitting layer from exiting the display cover, and the first electrode layer is a transparent electrode layer.

For example, the black matrix is provided on a side of the optical sensing components near the second base substrate; or, the black matrix is provided on the side of the optical sensing components away from the second base substrate, and an orthographic projection of the black matrix on the second base substrate does not overlap with the orthographic projection of the optical sensing components on the second base substrate.

For example, the display cover further comprises: a switch circuit in each of the second pixel regions, and a control circuit, for each of the second pixel regions, a switch circuit in the second pixel region being configured to control whether an electrical signal from an optical sensing component in the second pixel region is input to the control circuit, the control circuit being configured to adjust a drive signal input to a pixel circuit in the first pixel region based on the electrical signal, the drive signal being used for the pixel circuit in the first pixel region to adjust a signal input to a first electrode in the first pixel region.

For example, the display cover further comprises a black matrix configured to block light emitted from the light-emitting layer from exiting the display cover, and the first electrode layer is a transparent electrode layer.

For example, the display cover further comprises a black matrix configured to block light emitted from the light-emitting layer from exiting the display cover, and the first electrode layer is a transparent electrode layer.

For example, the display cover further comprises a black matrix configured to block light emitted from the light-emitting layer from exiting the display cover, and the first electrode layer is a transparent electrode layer.

According to at least one embodiment of the present disclosure a method of manufacturing a display panel is provided, comprising: providing a first base substrate; determining positions of a plurality of first pixel regions for forming an array arrangement on the first base substrate; forming a pixel circuit layer on the first base substrate, the pixel circuit layer comprising a plurality of pixel circuits, and the plurality of pixel circuits being correspondingly arranged in the plurality of first pixel regions one to one; sequentially forming a first electrode layer, a light-emitting layer and a second transparent electrode layer on the first base substrate formed with the pixel circuit layer, the first electrode layer comprising a first electrode located in each of the first pixel regions, and a pixel circuit in each first pixel region providing a signal to the first electrode in the each of the first pixel region; providing a second base substrate; determining positions of a plurality of second pixel regions for forming an array arrangement on the second base substrate; forming a plurality of optical sensing components on the second base substrate, the plurality of optical sensing components being correspondingly arranged in the plurality of second pixel regions one to one; and cell-assembling the second base substrate formed with the optical sensing components with the first base substrate formed with the second transparent electrode layer so that the plurality of first pixel regions on the first base substrate correspond to the plurality of second pixel regions on the second base substrate one to one. The optical sensing components receive optical signals emitted by a light-emitting layer in each of the first pixel regions corresponding to the second pixel regions where the optical sensing components are positioned, and convert the optical signals into electrical signals, the electrical signals being used for adjusting signals input to each of the first electrodes in a corresponding first pixel region by pixel circuits in the corresponding first pixel region.

For example, before forming of the plurality of optical sensing components on the second base substrate, forming a switch circuit layer on the second base substrate. The switch circuit layer comprises a plurality of switch circuits, the plurality of switch circuits are arranged in the plurality of second pixel regions in one to one correspondence, for each of the second pixel regions, a switch circuit in the second pixel region controlling whether an electrical signal from an optical sensing component in the second pixel region is input to the control circuit, the control circuit adjusting a drive signal input to a pixel circuit in the first pixel region based on the electrical signal, the drive signal being used for the pixel circuit in the first pixel region to adjust a signal input to a first electrode in the first pixel region. Forming of the plurality of optical sensing components on the second base substrate comprises forming the optical sensing components on the second base substrate formed with the switching circuit layer.

For example, before forming of the plurality of optical sensing components on the second base substrate, forming a black matrix on the second base substrate; forming of the plurality of optical sensing components on the second base substrate comprises: forming the optical sensing component on the second base substrate formed with black matrix; or, after forming of the plurality of optical sensing components on the second base substrate, forming a black matrix on the second base substrate formed with the optical sensing components, and an orthographic projection of the black matrix on the second base substrate does not overlap with the orthographic projection of the optical sensing components on the second base substrate.

According to at least one embodiment of the present disclosure, a display device is provided, comprising the display panel.

BRIEF DESCRIPTION OF THE DRAWINGS

The embodiments of the present disclosure will be described in more detail below with reference to the accompanying drawings in order to enable those of ordinary skill in the art to more clearly understand the embodiments of the present disclosure, in which.

DETAILED DESCRIPTION

Figure 1:
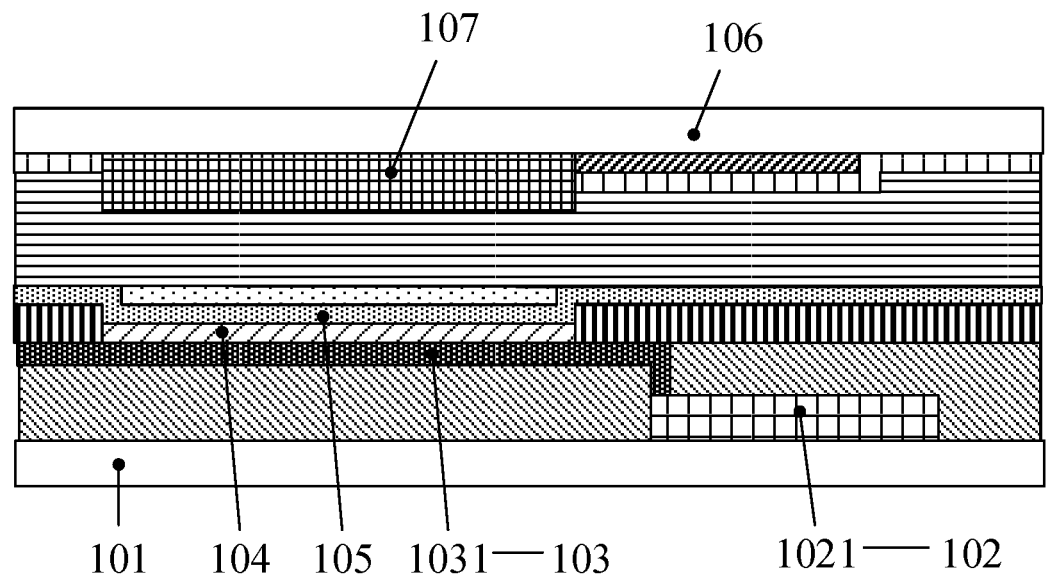
FIG. 1 is a schematically structural diagram of a display panel provided by an embodiment of the present disclosure.

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may also include an electrical connection/coupling, directly or indirectly. The terms, "on," "under," "left," "right," or the like are only used to indicate relative position relationship, and when the position of the object which is described is changed, the relative position relationship may be changed accordingly.

The inventor noticed that with the use of the display panel, the performance of the anode layer, the light-emitting layer, the cathode layer, the pixel circuit, etc. on the display panel may deteriorate, resulting in the display effect of the display panel being affected. For example, this performance degradation may result in lower display brightness of the display panel and poor uniformity of display brightness of a plurality of pixel regions in the display panel.

In a display panel, an optical sensor may be provided. The optical sensor can convert the optical signal emitted by the light-emitting layer in the pixel region where the optical sensor is located into an electrical signal for the control circuit to adjust the driving voltage input to the pixel circuit in the pixel region according to the electrical signal to compensate the light-emitting effect of the light-emitting layer in the corresponding pixel region.

However, the fabricating process of the optical sensor will have a serious impact on the manufacturing process of the pixel circuit, resulting in the poor electrical performance of the formed pixel circuit. For example, when an optical sensor is prepared by using an amorphous silicon (a-Si) process, more hydrogen will be generated in the fabrication process of the optical sensor, and this more hydrogen will have a more serious impact on the fabrication process of the pixel circuit. For example, it may cause the threshold voltage of the pixel circuit to be negative or cause poor uniformity of the display brightness of a plurality of pixel regions in the display panel. In addition, the display panel may also be provided with a switch circuit, and both the switch circuit and the pixel circuit are arranged in a non-display area, resulting in a smaller area of the display area and affecting the aperture ratio of the display area of the pixel unit. At the same time, the circuit structure on the display panel is complicated, which leads to serious signal interference between circuits and affects the display effect of the display panel.

An embodiment of the present disclosure provides a display panel, which may include a display backplane and a display cover which are assembled to form a cell (cell-assembled). The display backplane includes a plurality of first pixel regions arranged in an array and a plurality of second pixel regions arranged in an array, and the positions of the plurality of first pixel regions correspond to the positions of the plurality of second pixel regions one to one.

As shown in FIG. 1, the display backplane may further include a first base substrate 101 and a pixel circuit layer 102, a first electrode layer 103, a light-emitting layer 104, and a second transparent electrode layer 105 stacked on the first base substrate 101. The pixel circuit layer 102 may include a plurality of pixel circuits 1021. The first electrode layer 103 may include a plurality of first electrodes 1031. The plurality of first electrodes 1031 and the plurality of pixel circuits 1021 are disposed in a plurality of first pixel regions in one to one correspondence. The pixel circuit 1021 in each first pixel region is used to provide a signal to the first electrode 1031 in the first pixel region. It is to be noted that the first pixel region include a display area and a non-display area. The pixel circuit 1021 may be disposed in the non-display area, and the light-emitting layer 104 may be disposed in the display area.

Continuing to refer to FIG. 1, the display cover may include a second base substrate 106 and a plurality of optical sensing components 107 disposed on the second base substrate 106. The plurality of optical sensing components 107 are disposed in a plurality of second pixel regions in one to one correspondence, each optical sensing component 107 is configured to receive an optical signal emitted from the light-emitting layer 104 in the first pixel region corresponding to the second pixel region in which the optical sensing component 107 is located, and convert the optical signal into an electrical signal for the pixel circuit 1021 in the corresponding first pixel region to adjust the signal input to the first electrode 1031 in the corresponding first pixel region.

For example, the optical sensing component 107 may include a photodiode. The photodiode may include a p-type semiconductor, a p-n junction, and an n-type semiconductor. The photodiode can detect an optical signal and convert the optical signal into an electrical signal. For example, the optical sensing components 107 may include a PIN photodiode.

In the display panel provided by the embodiment of the present disclosure, the display panel comprises a display backplane and a display cover assembled to form a cell, the display backplane comprising a pixel circuit layer, and the display cover comprising optical sensing components. As the optical sensing components and the pixel circuit are arranged on different base substrates, it is not required to form an optical sensing component on the base substrate on which the pixel circuit is formed. In this way, the affect of the manufacturing process of the optical sensing components on the manufacturing process of the pixel circuit can be avoided, the electrical performance of the pixel circuit is improved, and the display effect of the display panel is improved.

The pixel circuit 1021 may include a plurality of thin film transistors (TFT) connected in a given manner. Each thin film transistor may be a TFT of a top-gate or a TFT of a bottom-gate type. When the thin film transistor is top-gate type, the thin film transistor may include an active layer, a first insulating layer, a gate electrode, a second gate insulating layer, a source drain pattern disposed on the first base substrate 101. When the thin film transistor is bottom-gate type, the thin film transistor may include a gate electrode, a gate insulating layer, an active layer, a source drain pattern disposed on the first base substrate 101.

For example, in order to prevent light incident from the outside of the display panel from affecting the electrical characteristics of the thin film transistors in the pixel circuit 1021, the display backplane may further include a first shield layer to shield light incident from the outside of the display panel. The first light shielding layer may be disposed on a side of the pixel circuit layer 102 near the second base substrate 106.

The first pixel region includes a display area and a non-display area. An orthographic projection of the display area on the second base substrate 106 may cover an orthographic projection of the optical sensing component 107 on the second base substrate 106. At this time, the optical signals emitted from the light-emitting layer 104 can be effectively detected by the optical sensing components 107, so as to improve the accuracy of the optical signals detected by the optical sensing components 107. For example, as shown in FIG. 2, the orthographic projection M of the display area on the second base substrate 106 may coincide with the orthographic projection N of the optical sensing component 107 on the second base substrate 106.

For example, when an optical sensing component 107 is arranged, the size of the light receiving surface of the optical sensing component 107 can be appropriately adjusted according to the cell alignment precision of the display backplane and the display cover, so that the light receiving surface can effectively receive light signals emitted by the light-emitting layer 104. For example, if the alignment instrument used for aligning the display backplane and the display cover is low in accuracy, the alignment accuracy of cell-assembling the display backplane and the display cover by aligning the display backplane and the display cover using the alignment instrument is low. So, when an optical sensing component 107 is arranged, the size of the optical sensing components 107 can be appropriately decreased to decrease the size of the light receiving surface of the optical sensing component 107, so that the light receiving surface of the optical sensing component 107 can effectively receive light signals emitted by the light-emitting layer 104 when the cell-assembling accuracy is low. As shown in FIG. 3, the width of the light receiving surface of the optical sensing component 107 shown in FIG. 3 is smaller than the width of the light receiving surface of the optical sensing component 107 shown in FIG. 2 (the width direction is parallel to the X direction), so that the light receiving surface can effectively receive light signals emitted by the light-emitting layer 104.

Further, for example, the display cover may further include a control circuit. The control circuit is used to adjust the drive signals input to the pixel circuit 1021 in the first pixel region based on the electrical signals from the optical sensing component 107, and the drive signals are used for the pixel circuit 1021 in the first pixel region to adjust the signals input to the first electrode 1031 in the first pixel region. And by adjusting the signals input to the first electrode 1031, the intensity of light emitted by the light-emitting layer 104 in the corresponding first pixel region can be controlled to achieve the effect of optical compensation to improve the display effect of the display panel. For example, the control circuit may be an Integrated Circuit (IC), a Central Processing Unit (CPU), or the like.

Figure 2:
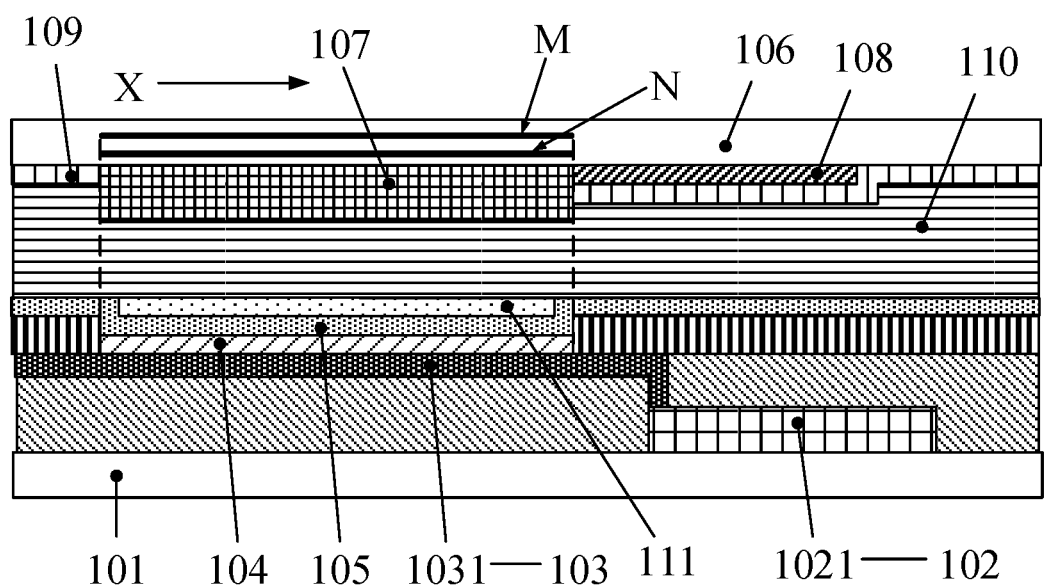
FIG. 2 is a schematically structural diagram of another display panel provided by an embodiment of the present disclosure.
Figure 3:
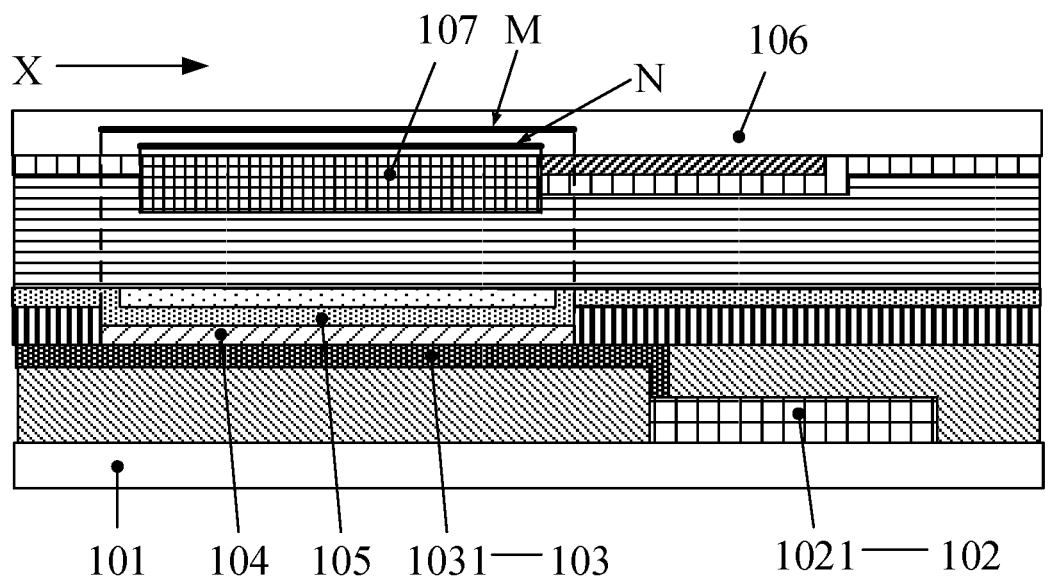
FIG. 3 is a schematically structural diagram of another display panel provided by an embodiment of the present disclosure.

As shown in FIG. 2, the display cover may further include a switch circuit 108 located in each second pixel region. The each second pixel region includes a display area and a non-display area. In this case, in order to improve the aperture ratio of the display panel, the switch circuit 108 may be disposed in the non-display area of the second pixel region.

For each second pixel region, the switching circuit 108 may be used to control whether to input an electrical signal from the optical sensing component 107 in the second pixel region to the control circuit. The input terminal of the switch circuit 108 may be connected to the output terminal of the optical sensing component 107, and the output terminal of the switch circuit 108 may be connected to the input terminal of the control circuit.

In an embodiment, by controlling the switch circuit 108 in the display panel, the optical sensing components in the second pixel regions of the plurality of rows included in the display panel can input electrical signals from the corresponding optical sensing components 107 to the control circuit row by row using every pixel row as a unit; or, the optical sensing components in the second pixel region of the plurality of columns included in the display panel can be made to input electrical signals from the corresponding optical sensing components 107 to the control circuit column by column by using every pixel column as a unit, so as to prevent the control circuit from overload operation due to too many electrical signals received and improve the accuracy of drive signals output by the control circuit.

In order to prevent light incident from the outside of the display panel from affecting the electrical characteristics of the thin film transistors in the switching circuit 108, the display backplane may further include a second light shielding layer to shield light incident from the outside of the display panel. The second light shielding layer may be disposed on a side of the switch circuit 108 near the second base substrate 106.

For example, as shown in FIG. 2, the display cover may further include a black matrix 109 for blocking light emitted from the light-emitting layer 104 from exiting the display cover. In this case, the first electrode layer 103 is a transparent electrode layer, and the display panel is a display panel of a bottom emission type. By setting the black matrix 109, the display effect of the display panel of the bottom emission type can be improved.

The black matrix can be arranged in a variety of ways, and the embodiment of the present disclosure will be set forth in the following implementation ways as examples.

In an implementation, the black matrix 109 may be disposed on the side of the optical sensing components 107 near the second base substrate 106. In this case, the arrangement of the black matrix may include the following situations.

Figure 4:
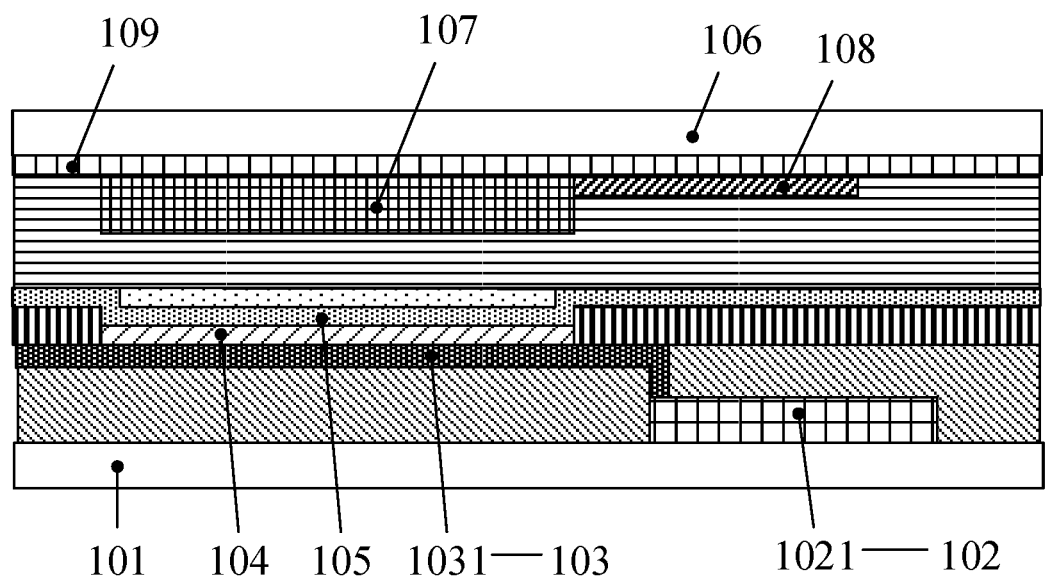
FIG. 4 is a schematically structural diagram of another display panel provided by an embodiment of the present disclosure.

For example, as shown in FIG. 4, the black matrix 109 may be disposed on the side of the optical sensing components 107 near the second base substrate 106, and the black matrix 109 may be disposed on the side of the switch circuit 108 near the second base substrate 106. Accordingly, when the display cover is prepared, the black matrix 109 may be formed first, and then the switch circuit 108 and the optical sensing components 107 may be sequentially formed on the second base substrate 106 on which the black matrix 109 is formed.

For another example, the black matrix 109 may be disposed on the side of the optical sensing components 107 near the second base substrate 106, and the black matrix 109 may be disposed on the side of the switch circuit 108 away from the second base substrate 106. Accordingly, when the display cover is prepared, the switching circuit 108 may be formed first, and then the black matrix 109 and the optical sensing components 107 may be sequentially formed on the second base substrate 106 on which the switching circuit 108 is formed. In this case, an orthographic projection of the black matrix 109 on the second base substrate 106 can cover an orthographic projection of the switch circuit 108 on the second base substrate 106, so as to prevent the metal device in the switch circuit 108 from reflecting the light irradiated on the metal device, which can reduce the interference of light between adjacent pixel units, and improve the display effect of the display panel.

In another implementation, the black matrix 109 may be disposed on the side of the optical sensing components 107 away from the second base substrate 106, and an orthographic projection of the black matrix 109 on the second base substrate 106 does not overlap with an orthographic projection of the optical sensing components 107 on the second base substrate 106.

In this case, an orthographic projection of the black matrix 109 on the second base substrate 106 may not overlap with an orthographic projection of the switch circuit 108 on the second base substrate 106; or, as shown in FIG. 2, an orthographic projection of the black matrix 109 on the second base substrate 106 may cover an orthographic projection of the switch circuit 108 on the second base substrate 106. When an orthographic projection of the black matrix 109 on the second base substrate 106 covers an orthographic projection of the switch circuit 108 on the second base substrate 106, the metal device in the switch circuit 108 can be prevented from reflecting the light irradiated on the metal device, which can reduce the interference of light between adjacent pixel units, and improve the display effect of the display panel.

The display cover may further include a first passivation layer. The first passivation layer may be disposed on a side of the optical sensing components 107 away from the second base substrate 106. For example, the first passivation layer may be disposed between the optical sensing components 107 and the black matrix 109.

For example, the optical sensing components 107 may further include a third electrode and a fourth electrode. The third electrode may be disposed on the side of the photodiode near the second base substrate 106, and the fourth electrode may be disposed on the side of the photodiode away from the second base substrate 106. By applying signals to the third electrode and the fourth electrode, the photodiode can be provided with conditions required for operation. The third electrode may be made of an opaque material to prevent light emitted from the light-emitting layer 104 from exiting the display backplane from the position where the optical sensing components 107 is located. Furthermore, the opaque material may have light reflection characteristics. For example, the material of the third electrode can be metal. Since metal has strong light reflection characteristics, the third electrode can reflect light irradiated to its surface to increase the light utilization rate of the display panel and improve the display effect of the display panel. The fourth electrode may be made of a transparent material (such as indium tin oxide) to enable the photodiode to effectively receive light emitted from the light-emitting layer 104.

As shown in FIG. 2, the display cover may further include a first planarization layer 110 disposed on a side of the optical sensing components 107 away from the second base substrate 106. The first planarization layer 110 may be made of a light-transmissive packaging material or a light-transmissive organic material so that the photodiode can effectively receive light emitted from the light-emitting layer 104. For example, the material of the first planarization layer 110 may be silicon dioxide (SiO$_2$), silicon nitride (SiN$_x$), or a mixture of SiO$_2$ and SiN$_x$. An orthographic projection of the first planarization layer 110 on the second base substrate 106 can cover an orthographic projection of the optical sensing component 107 on the second base substrate 106. In this case, the first planarization layer 110 can form a space between each of the optical sensing components 107 and the pixel circuit 1021, which can reduce the signal interference between the optical sensing components 107 and the pixel circuit 1021, allow the capacitive coupling effect between the optical sensing components 107 and the pixel circuit 1021 to be small, and improve the display effect of the display circuit; and/or an orthographic projection of the first planarization layer 110 on the second base substrate 106 can also cover an orthographic projection of the switch circuit 108 on the second base substrate 106. In this case, the first planarization layer 110 can form an interval between the switch circuit 108 and the pixel circuit 1021, which can reduce the signal interference between the switch circuit 108 and the pixel circuit 1021, allow the capacitive coupling effect between the switch circuit 108 and the pixel circuit 1021 to be small, and improve the display effect of the display circuit.

As shown in FIG. 2, for example, the first planarization layer 110 may be a whole layer structure. When the first planarization layer 110 is of a whole-layer structure, the first planarization layer 110 can reduce the segment gap between the switch circuit 108 and the optical sensing component 107, so as to realize the planarization of the display cover.

Further, for example, as shown in FIG. 2, the display backplane may further include a second planarization layer 111 disposed on the side of the second transparent electrode layer 105 away from the first base substrate 101. The second planarization layer 111 may planarize the surface of the second transparent electrode layer 105 away from the first base substrate 101 to planarize the display backplane. The first planarization layer 110 may contact the second planarization layer 111 after the display backplane and the display cover are cell-assembled with each other. The material of the second planarization layer 111 may be a light-transmissive packaging material or a light-transmissive organic material. And the material of the second planarization layer 111 may be the same as that of the first planarization layer 110. For example, the materials of the second planarization layer 111 and the first planarization layer 110 may be silicon dioxide (SiO$_2$), silicon nitride (SiN$_x$), or a mixture of SiO$_2$ and SiN$_x$. In addition, the thicknesses of the first planarization layer and the thickness of the second planarization layer can be designed as required so as to reduce signal interference between the display backplane and the display cover.

Figure 5:
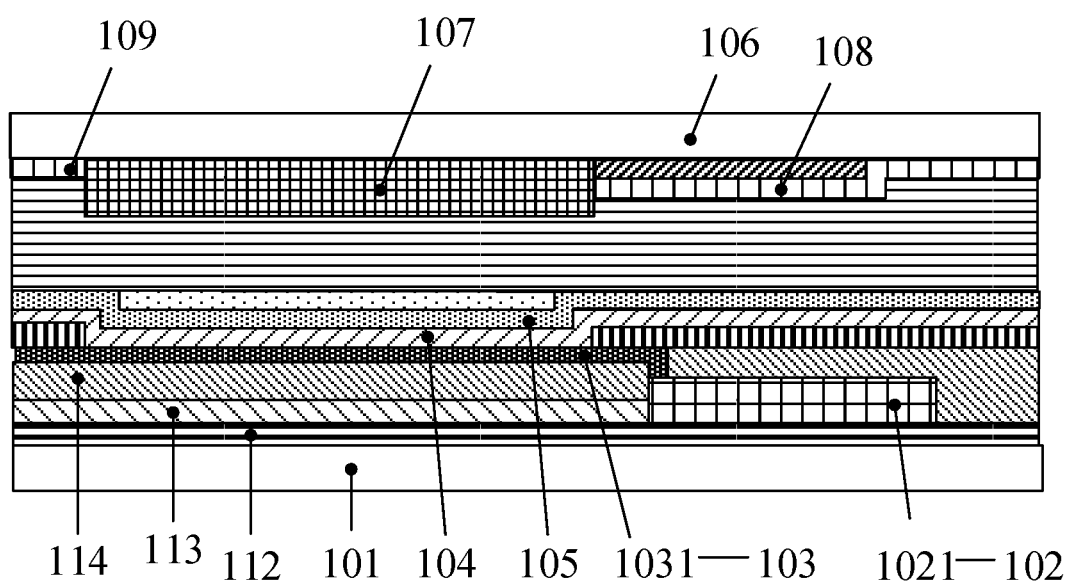
FIG. 5 is a schematically structural diagram of another display panel provided by an embodiment of the present disclosure.

For example, as shown in FIG. 5, the display backplane may further include film layers, such as a second passivation layer 112, a third passivation layer (not shown in FIG. 5), a color filter layer 113, and a third planarization layer 114. The second passivation layer 112 may be disposed on a side of the pixel circuit layer near the first base substrate, the third passivation layer, the color filter layer 113, and the third planarization layer 114 may be stacked on a side of the pixel circuit layer away from the first base substrate 101, and the first electrode layer 103, the light-emitting layer 104, and the second transparent electrode layer 105 may be disposed on a side of the third planarization layer 114 away from the first base substrate 101. The third planarization layer 114 may be made of resin.

In an implementation, the light-emitting layer may be formed by a solution process. In this case, the display backplane may further include a pixel definition layer. In the solution process, the pixel definition layer is configured to define that the solution in which the luminescent material is dissolved accurately flows into a designated pixel region. The pixel definition layer may be disposed on a side of the first electrode layer 103 away from the first base substrate 101, and the light-emitting layer 104 may be disposed in a pixel region defined by the pixel definition layer.

For example, it may be determined whether an auxiliary cathode layer is arranged in the display panel and the thickness of the second transparent electrode 105 to be arranged according to the material of the second transparent electrode layer 105. For example, when the second transparent electrode layer 105 is made of a transparent conductive material (such as indium tin oxide), the resistance of the second transparent electrode layer 105 may be large, and the display effect of the display panel may be affected, to prevent bad display effect due to large resistance of the electrode layer, an auxiliary cathode layer may be provided in the display panel, which may be made of a material having a small resistance, and the auxiliary cathode layer is connected in parallel with the second transparent electrode layer 105, so as to reduce the resistance of the overall structure including the second transparent electrode layer 105 and the auxiliary cathode layer. In this case, the function of the original second transparent electrode layer 105 can be realized by this integral structure. Since the auxiliary cathode layer has a smaller resistance, when the auxiliary cathode layer is connected in parallel with the second transparent electrode layer 105, its parallel resistance will be smaller than that of the auxiliary cathode layer, allowing the resistance of the overall structure to be smaller. In this way, the display effect of the display panel can be improved.

In an implementation, the auxiliary cathode layer may be disposed on the side of the first electrode layer 103 away from the first base substrate 101, and the light-emitting layer 104 and the second transparent electrode layer 105 may be disposed on the side of the auxiliary cathode layer away from the first base substrate 101. In this case, the first electrode layer 103 is insulated from the auxiliary cathode layer, and the auxiliary cathode layer is connected in parallel with the second transparent electrode layer 105. Furthermore, for example, the auxiliary cathode layer may include a plurality of auxiliary cathode structures, each of which may be disposed in a non-display area of the first pixel region to improve the aperture ratio of the display panel.

Further, for example, it is also possible to determine the thickness of the second transparent electrode layer 105 to be provided and whether or not an auxiliary cathode layer is provided in the display panel according to the size and power consumption of the display panel. For example, when the size of the display panel is large, the size of the second transparent electrode layer 105 is large, so that the resistance of the second transparent electrode layer 105 will be large. In this case, the display effect of the display panel can be improved by providing the auxiliary cathode layer; or, when the power consumption of the display panel is large, an auxiliary cathode layer may be provided in the display panel to reduce the resistance of the overall structure including the second transparent electrode layer 105 and the auxiliary cathode layer and reduce the overall power consumption of the display panel.

The display panel provided by the embodiments of the disclosure comprises a display backplane and a display cover which are assembled to form a cell. The display backplane comprises a pixel circuit layer, and the display cover comprises optical sensing components; as the optical sensing components and the pixel circuit are arranged on different base substrates, it is not needed to form optical sensors on the base substrate on which the pixel circuit is formed, so that the affect of the preparing process of the optical sensing components on the preparing process of the pixel circuit can be avoided, the electrical performance of the pixel circuit is improved, and the display effect of the display panel is improved. When the display panel is a bottom emission type display panel, since the optical sensing components and the switch circuit are both arranged on the display cover, the arrangement of the optical sensing components and the switch circuit does not affect the area of the display area on the display backplane, and the aperture ratio of the display panel is improved.

Figure 6:
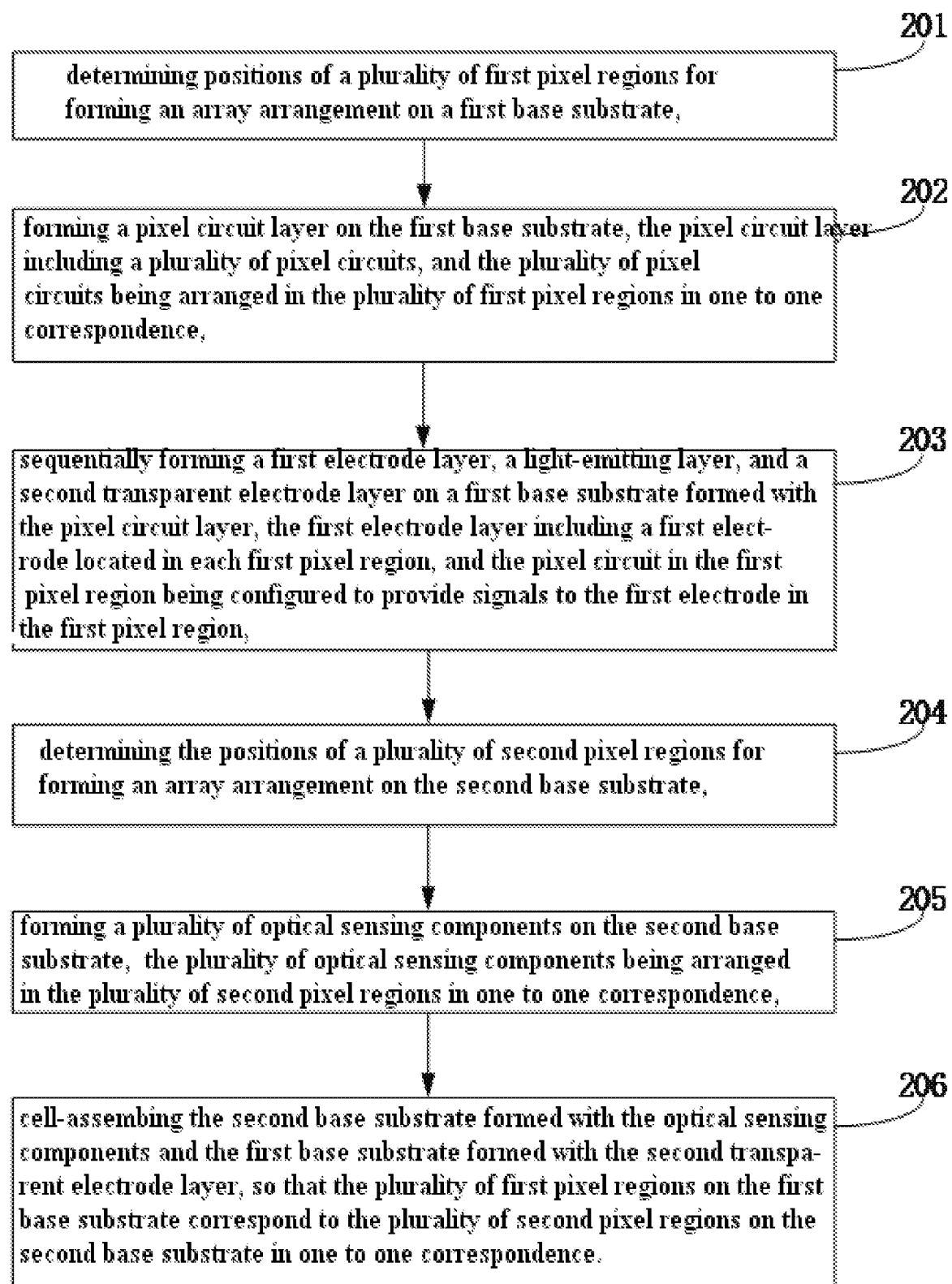
FIG. 6 is a flowchart of a method of manufacturing a display panel provided by an embodiment of the present disclosure.

An embodiment of the disclosure also provides a method of manufacturing the display panel, which can be used for manufacturing the display panel provided by the embodiment of the disclosure. Referring to FIG. 6, the method may include following operations.

Step 201: Determining positions of a plurality of first pixel regions for forming an array arrangement on a first base substrate.

Step 202: A pixel circuit layer is formed on the first base substrate, the pixel circuit layer includes a plurality of pixel circuits, and the plurality of pixel circuits are arranged in a plurality of first pixel regions in one to one correspondence.

Step 203: A first electrode layer, a light-emitting layer, and a second transparent electrode layer are sequentially formed on a first base substrate on which a pixel circuit layer is formed. The first electrode layer may include a first electrode located in each first pixel region, and the pixel circuit in the first pixel region is configured to provide signals to the first electrode in the first pixel region.

Step 204: Determining the positions of a plurality of second pixel regions for forming an array arrangement on the second base substrate.

Step 205: A plurality of optical sensing components are formed on the second base substrate, and the plurality of optical sensing components are arranged in the plurality of second pixel regions in one to one correspondence.

In step 206, the second base substrate on which the optical sensing components is formed and the first base substrate on which the second transparent electrode layer is formed are cell-assembled so that the plurality of first pixel regions on the first base substrate correspond to the plurality of second pixel regions on the second base substrate in one to one correspondence.

Each of the optical sensing components is configured to receive an optical signal emitted by a light-emitting layer in a first pixel region corresponding to a second pixel region where the optical sensing component is located and converting the optical signal into an electrical signal which is used for adjusting a signal input to a first electrode in a corresponding first pixel region by a pixel circuit in the corresponding first pixel region.

According to the method of manufacturing the display panel provided by the embodiment of the disclosure, the display panel manufactured by the method comprises a display backplane and a display cover which are assembled to form a cell. The display backplane comprises a pixel circuit layer formed on a first base substrate, and the display cover comprises optical sensing components formed on a second base substrate. As the optical sensing components and the pixel circuit(s) are arranged on different base substrates, it is not needed to be form the optical sensing components on the base substrate on which the pixel circuit layer of the pixel circuit(s) is formed, the affect of the manufacturing process of the optical sensing components on the manufacturing process of the pixel circuit(s) can be avoided, the electrical performance of the pixel circuit is improved, and the display effect of the display panel is improved.

Figure 7:
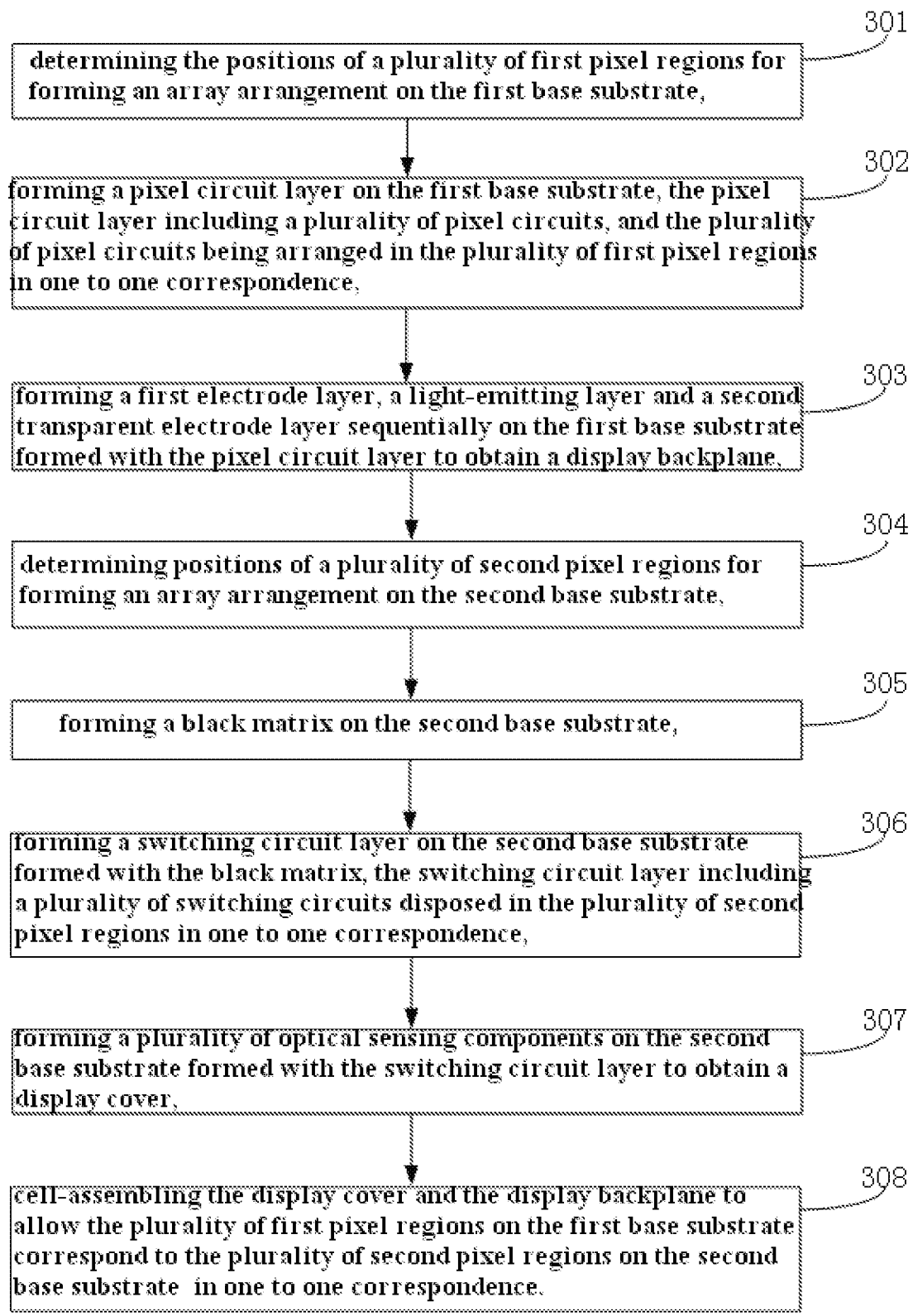
FIG. 7 is a flowchart of another method of manufacturing a display panel provided by an embodiment of the present disclosure.

An embodiment of the disclosure also provides another method of manufacturing the display panel, which can be used for manufacturing the display panel provided by the embodiments of the disclosure. Referring to FIG. 7, the method may include following operations.

Step 301: Determining the positions of a plurality of first pixel regions for forming an array arrangement on the first base substrate.

For example, the positions of the plurality of first pixel regions may be determined as needed.

Step 302: A pixel circuit layer is formed on the first base substrate. The pixel circuit layer includes a plurality of pixel circuits, and the plurality of pixel circuits are arranged in a plurality of first pixel regions in one to one correspondence.

For example, each pixel circuit may include a plurality of thin film transistors connected in a preset manner, and the connection manner between the thin film transistors may be determined as required. Accordingly, the process of forming the pixel circuit layer can be regarded as a process of forming thin film transistor(s) on the first base substrate. And each thin film transistor can be a TFT of top-gate type or a TFT of bottom-gate type. When the thin film transistor is a TFT of the top-gate type, the process of forming the thin film transistor may include sequentially forming an active layer, a first insulating layer, a gate electrode, a second gate insulating layer, and a source drain pattern on a first base substrate. When the thin film transistor is a TFT of the bottom gate type, the process of forming the thin film transistor may include sequentially forming a gate electrode, a gate insulating layer, an active layer, and a source-drain pattern on a first base substrate. For example, the thin film transistor can also be prepared by an amorphous silicon process, a low temperature poly-silicon technology or an oxide process.

For example, a layer of semiconductor material with a given thickness can be deposited on the first base substrate by a process, such as magnetron sputtering, thermal evaporation, or plasma enhanced chemical vapor deposition to obtain a semiconductor material layer, and the semiconductor material layer is processed by a patterning process to obtain an active layer. For example, the patterning process may include photoresist coating, exposure, development, etching and photoresist stripping. The semiconductor material may be amorphous silicon or polysilicon or the like. And the thickness of the active layer can be determined as required. Processes of forming other film layers in the thin film transistor can refer to the process of forming the active layer accordingly.

Figure 8:
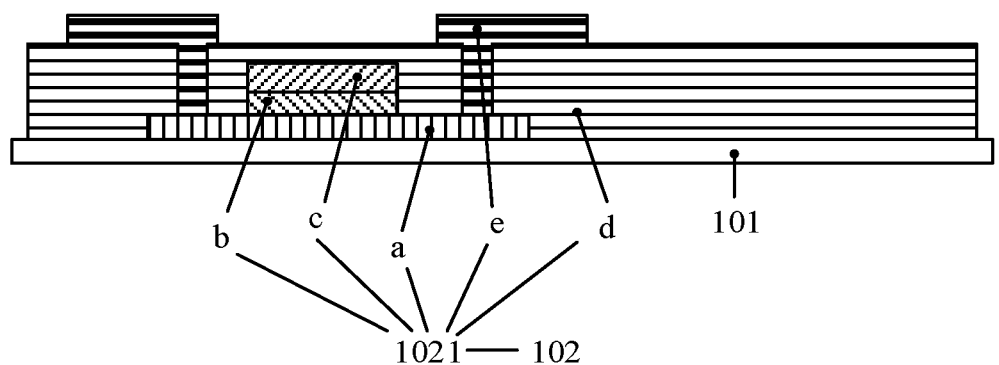
FIG. 8 is a schematically structural diagram after forming an active layer, a first gate insulating layer, a gate electrode, a second gate insulating layer, and source and drain patterns on a first base substrate according to an embodiment of the present disclosure.

Exemplarily, FIG. 8 shows a schematically structural diagram after forming an active layer a, a first gate insulating layer b, a gate electrode c, a second gate insulating layer d and a source-drain pattern e on a first base substrate 101 according to an embodiment of the present disclosure.

For example, in order to prevent light incident from the outside of the display panel from affecting the electrical characteristics of the thin film transistors in the pixel circuit, the display backplane may further include a first light shielding layer to shield light incident from the outside of the display panel. In this case, the first light shielding layer may be formed on the first base substrate before the pixel circuit layer is formed.

Step 303: A first electrode layer, a light-emitting layer and a second transparent electrode layer are sequentially formed on the first base substrate on which the pixel circuit layer is formed to obtain a display backplane.

For example, the first electrode layer may include a first electrode located in each first pixel region, and a pixel circuit in the first pixel region is configured to provide signals to the first electrode in the first pixel region.

The process of magnetron sputtering, thermal evaporation or PECVD can be adopted to deposit a layer of first conductive material with a given thickness on the first base substrate on which the pixel circuit layer is formed to obtain a first conductive material layer, and the first conductive material layer is processed through a patterning process to obtain a first electrode layer. Exemplarily, the first conductive material may be metallic molybdenum (Mo), metallic copper (Cu), metallic aluminum (Al), or alloy materials thereof.

An evaporation process or a solution process can be adopted to deposit a layer of light-emitting material with a given thickness on the first base substrate on which the first electrode layer is formed to obtain a light-emitting material layer, and then the luminescent material layer is processed by a patterning process to obtain the light-emitting layer. For example, the thickness of the light-emitting material and the light-emitting layer can be determined as required.

It is to be noted that when a light-emitting layer is formed by a solution process, a pixel definition layer is also formed on the first base substrate on which the first electrode layer is formed before the light-emitting layer is formed. In the solution process, the pixel definition layer is configured to limit the solution dissolving the luminescent material to accurately flow into the designated pixel region.

Figure 9:
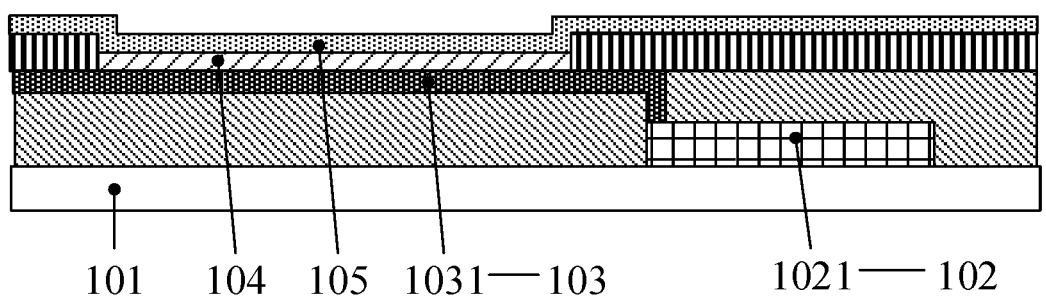
FIG. 9 is a schematically structural diagram after forming a second transparent electrode layer on a first base substrate formed with a light-emitting layer according to an embodiment of the present disclosure.

A transparent conductive material with a given thickness can be deposited on the first base substrate formed with the light-emitting layer by magnetron sputtering, thermal evaporation, PECVD and other processes to obtain a transparent conductive material layer, and then the transparent conductive material layer is processed by a patterning process to obtain a second transparent electrode layer. For example, the transparent conductive material may be indium tin oxide or indium zinc oxide. And the thickness of the second transparent electrode layer can be determined as required. For example, a schematically structural diagram after the second transparent electrode layer 105 is formed on the first base substrate 101 formed with the light-emitting layer 104 is shown in FIG. 9.

For example, the display backplane may further include an auxiliary cathode layer. The auxiliary cathode layer may be disposed on a side of the first electrode layer away from the first base substrate, and the light-emitting layer and the second transparent electrode layer may be disposed on a side of the auxiliary cathode layer away from the first base substrate. In this case, an auxiliary cathode layer may be formed on the first base substrate on which the first electrode layer is formed, and a light-emitting layer and a second transparent electrode layer may be formed on the first base substrate formed with the auxiliary cathode layer.

For example, after the second transparent electrode layer is formed, a second planarization layer may also be formed on the first base substrate on which the second transparent electrode layer is formed, and the second planarization layer may planarize the surface of the second transparent electrode layer away from the first base substrate to planarize the display backplane.

Figure 10:
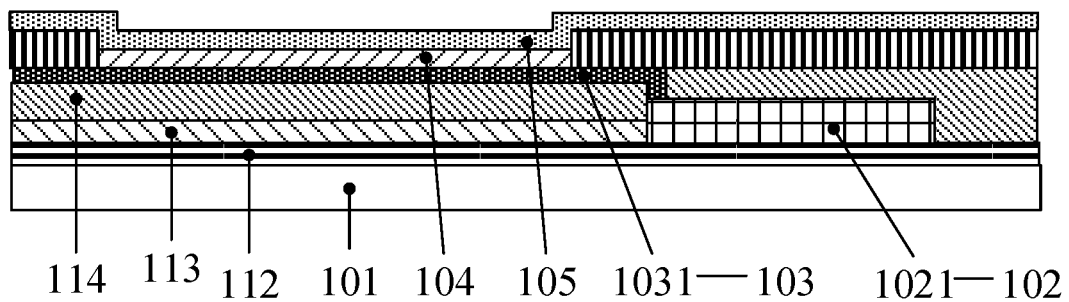
FIG. 10 is another schematically structural diagram after forming a second transparent electrode layer on a first base substrate formed with a light-emitting layer according to an embodiment of the present disclosure.

It is to be noted that the display backplane may further include a second passivation layer, a third passivation layer, a color filter layer, and a third planarization layer. For example, the second passivation layer may be formed on a first base substrate, and a pixel circuit layer may be formed on the first base substrate on which the second passivation layer is formed. A third passivation layer, a color filter layer, and a third planarization layer may be formed on the substrate on which the pixel circuit layer is formed, and a first electrode layer, a light-emitting layer, and a second transparent electrode layer may be sequentially formed on the first base substrate on which the third planarization layer is formed, as shown in FIG. 10.

Step 304: Determining positions of a plurality of second pixel regions for forming an array arrangement on the second base substrate.

The positions of the plurality of second pixel regions can be determined as required.

Step 305: A black matrix is formed on the second base substrate.

A layer of light-blocking material with a given thickness can be deposited on the second base substrate by a magnetron sputtering process, a thermal evaporation process, PECVD and other processes to obtain a black matrix. For example, the black matrix is configured to block light emitted from the light-emitting layer from exiting the display cover.

Step 306: A switching circuit layer is formed on the second base substrate on which the black matrix is formed. The switching circuit layer includes a plurality of switching circuits disposed in the plurality of second pixel regions in one to one correspondence.

For example, each switching circuit may include a plurality of thin film transistors connected in a preset manner, and the connection manner between the thin film transistors may be determined as required. Accordingly, the process of forming the switching circuit layer can be regarded as a process of forming a thin film transistor. And the implementation process of forming the thin film transistor can correspondingly refer to the implementation process of the thin film transistor in the pixel circuit formed in step 302.

For example, the display panel may further include a control circuit for adjusting a drive signal input to a pixel circuit in the first pixel region based on the electrical signal. The driving signal is used for the pixel circuit in the first pixel region to adjust the signal input to the first electrode in the first pixel region. By adjusting the signal input to the first electrode, the intensity of light emitted by the light-emitting layer of the display backplane can be controlled to achieve the effect of optical compensation and improve the display effect of the display panel. For each second pixel region, the switch circuit in the second pixel region is configured to control whether to input an electrical signal from an optical sensing component in the second pixel region to the control circuit, so as to prevent the control circuit from overload operation due to too many electrical signals being received and improve the accuracy of the drive signals output by the control circuits.

For example, to prevent light incident from the outside of the display panel from affecting the electrical characteristics of thin film transistors in the switching circuit(s), the display backplane may further include a second light shielding layer to shield light incident from the outside of the display panel. In this case, the second light shielding layer may be formed on the second base substrate before the switch circuit layer is formed.

Step 307: A plurality of optical sensing components are formed on the second base substrate on which the switching circuit layer is formed to obtain a display cover.

The plurality of optical sensing components are disposed in the plurality of second pixel regions in one to one correspondence.

For example, each of the optical sensing components may include a photodiode, which may be formed on a second base substrate formed with a switching circuit layer by an amorphous silicon process. The photodiode may include a p-type semiconductor, a p-n junction, and an n-type semiconductor.

The optical sensing component may further include a third electrode layer disposed on a side of the photodiode near the second base substrate, and a fourth electrode layer disposed on a side of the photodiode away from the second base substrate. In this case, a third electrode layer may be formed on the second base substrate on which the switching circuit layer is formed, a photodiode may be formed on the second base substrate on which the third electrode layer is formed, and a fourth electrode layer may be formed on the second base substrate on which the photodiode is formed. For example, by applying signals to the third electrode and the fourth electrode, the photodiode can be provided with conditions necessary for operation.

For example, the third electrode may be made of an opaque material to prevent light emitted from the light-emitting layer 104 from being emitted from the position where the optical sensing element 107 is located. For example, the opaque material may have light reflection characteristics. For example, the material of the third electrode can be metal. Since metal has strong light reflection characteristics, when the third electrode is made of metal, the third electrode can reflect light irradiated to its surface to increase the light utilization rate of the display panel and improve the display effect of the display panel. The fourth electrode may be made of a transparent material (such as indium tin oxide) to enable the photodiode to effectively receive light emitted from the light-emitting layer 104.

It is to be noted that step 305 may be an optional step. For example, in the process of manufacturing the display panel, it is possible to choose not performing step 305 and form a black matrix on the second base substrate formed with the switch circuit layer, and form optical sensing components on the second base substrate formed with the black matrix to block light emitted from the light-emitting layer from exiting the display cover; or, a black matrix may be formed on the second base substrate on which the optical sensing components is formed. For example, an orthographic projection of the black matrix on the second base substrate can cover an orthographic projection of the switch circuit on the second base substrate to prevent the metal device in the switch circuit from reflecting the light irradiated on the metal device, reduce the light interference between adjacent pixel units, and improve the display effect of the display panel.

Figure 11:
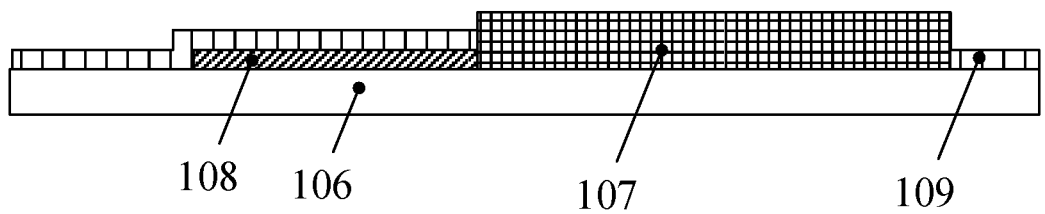
FIG. 11 is a schematically structural diagram after forming a black matrix on a second base substrate on which an optical sensing components is formed according to an embodiment of the present disclosure.

Exemplarily, FIG. 11 shows a schematically structural diagram after a black matrix 109 is formed on a second base substrate 106 on which an optical sensing component 107 is formed according to an embodiment of the present disclosure.

It is to be noted that after the optical sensing component is formed on the second base substrate, the first passivation layer may be formed on the second base substrate on which the optical sensing component is formed. Exemplarily, a first passivation layer may be formed on the second base substrate on which the optical sensing components is formed, and then a black matrix may be formed on the second base substrate on which the first passivation layer is formed.

For example, the display cover may further include a first planarization layer disposed on a side of the optical sensing components away from the second base substrate. For example, when a black matrix is formed on a surface of the optical sensing components away from the substrate, the first planarization layer may be disposed on a side of the black matrix away from the base substrate.

Step 308: cell-assembling the display cover and the display backplane so that the plurality of first pixel regions on the first base substrate correspond to the plurality of second pixel regions on the second base substrate in one to one correspondence.

The display cover and the display backplane can be packaged before the display cover and the display backplane are cell-assembled together. For example, the display cover and the display backplane can be encapsulated by using sealant or face glue to improve the sealing performance of the display panel after the cell is formed.

Figure 12:
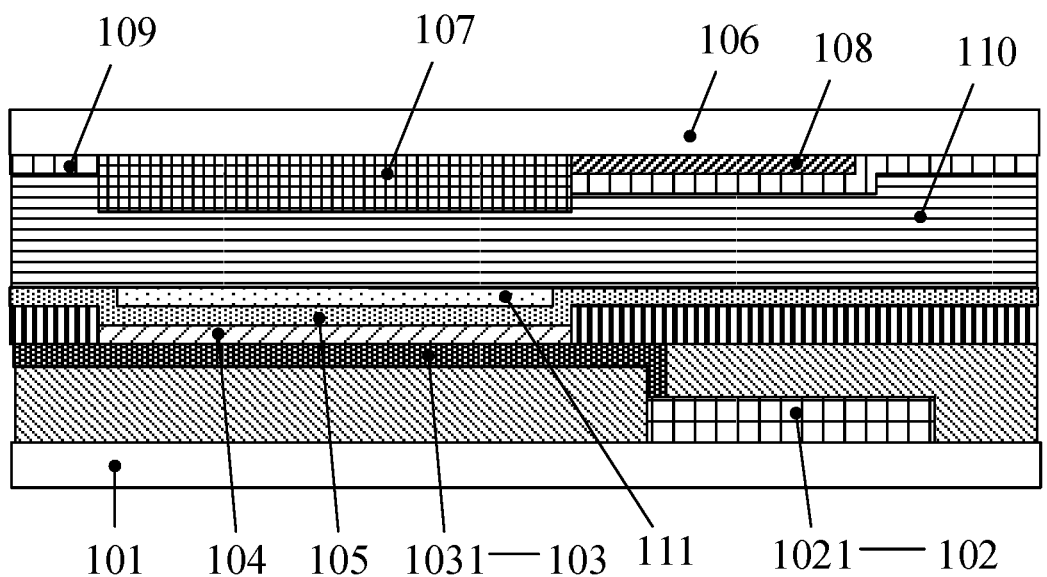
FIG. 12 is a schematically structural diagram of a display backplane and a display cover after being cell-assembled according to an embodiment of the present disclosure.

Exemplarily, FIG. 12 shows a schematically structural diagram of a display backplane and a display cover after being cell-assembled according to an embodiment of the present disclosure.

It is to be noted that when the optical sensing components is arranged, the size of the light receiving surface of each optical sensing component can be appropriately adjusted according to the cell alignment precision of the display backplane and the display cover, so that the light receiving surface can effectively receive the light signals emitted by the light-emitting layer. For example, if the alignment instrument used for aligning the display backplane and the display cover is low in accuracy, the alignment accuracy of cell-assembling of the display backplane and the display cover by aligning the display backplane and the display cover using the alignment instrument is low. So, when the optical sensing components are arranged, the size of the optical sensing components can be appropriately decreased, so that the light receiving surface of the optical sensing component 107 can also effectively receive light signals emitted by the light-emitting layer 104 when the accuracy of the cell-assembling is low, so as to decrease the size of the light receiving surface of the optical sensing component.

For example, in a display panel with higher resolution, due to the small size of the pixel regions in the display panel, high requirements are put forward to the accuracy of the cell-assembling. In this case, by appropriately decreasing the size of the optical sensing components, the light receiving surfaces of the optical sensing components can effectively receive the light signals emitted by the light-emitting layer.

For example, when the optical sensing component includes a third electrode disposed on a side of the photodiode near the second base substrate, and the third electrode is made of a material having light reflection characteristics, since the larger the cross-sectional area of the third electrode is, the larger the amount of light reflected by the third electrode is, in this case, the display brightness of the display panel can be increased by appropriately increasing the area of the third electrode.

According to the method of manufacturing the display panel provided by the embodiment of the disclosure, the display panel manufactured by the method comprises a display backplane and a display cover which are assembled to form a cell. The display backplane comprises a pixel circuit layer formed on a first base substrate, and the display cover comprises optical sensing component(s) formed on a second base substrate. As the optical sensing component(s) and the pixel circuit are arranged on different base substrates, it is not needed to form the optical sensing component(s) on the base substrate on which the pixel circuit is formed, the affect of the preparing process of the optical sensing component(s) on the preparing process of the pixel circuit can be avoided, the electrical performance of the pixel circuit is improved, and the display effect of the display panel is improved. For example, when the display panel is a bottom emission type display panel, since the optical sensing components and the switch circuit are both arranged on the display cover, the arrangement of the optical sensing component(s) and the switch circuit will not affect the area of the display area on the display backplane, which improves the aperture ratio of the display panel.

It is to be noted that the sequence of steps in the method of manufacturing the display panel provided by the embodiments of the present disclosure can be appropriately adjusted, and the steps can also be correspondingly increased or decreased according to situations, all of which should fall in the scope of the present disclosure, so they will not be repeated here.

An embodiment of the present disclosure also provides a display device, which may include the display panel provided by the embodiments of the present disclosure.

For example, the display device can be a device of a liquid crystal panel, electronic paper, an organic light-emitting diode panel, a mobile phone, a tablet computer, a television, a display, a notebook computer, a digital photo frame, a navigator and other devices with display function.

The following points is noted:

(1) The accompanying drawings of the embodiments of the present disclosure only involve structures relevant to the embodiments of the present disclosure, and other structures may refer to a common design.

(2) Without conflicting with each other, the embodiments of the present disclosure and the characteristics in the embodiments may be combined to obtain new embodiments.

The foregoing is only the exemplary embodiments of the present disclosure, and the scope of the present disclosure is not limited thereto. A person of ordinary skill in the art can make various changes and modifications without departing from the present disclosure, and such changes and modifications shall fall into the scope of the present disclosure.

What is claimed is:

1. A display panel, comprising: a display backplane and a display cover assembled to be a cell, wherein the display backplane comprises a plurality of first pixel regions in an array, and the display cover comprises a plurality of second pixel regions in an array, positions of the plurality of first pixel regions being correspond to positions of the plurality of second pixel regions one to one;

the display backplane further comprises a first base substrate, and a pixel circuit layer, a first electrode layer, a light-emitting layer and a second transparent electrode layer stacked on the first base substrate, wherein the pixel circuit layer comprises a plurality of pixel circuits, the first electrode layer comprises a plurality of first electrodes, the plurality of first electrodes and the plurality of pixel circuits being respectively provided in the plurality of first pixel regions in one to one correspondence, and each of the pixel circuits in the first pixel regions being configured to provide signals to the first electrodes in the first pixel regions; and the display cover further comprises:

a second base substrate:

a plurality of optical sensing components on the second base substrate, wherein the plurality of optical sensing components are provided in the plurality of second pixel regions in one to one correspondence, and the optical sensing components being configured to receive optical signals emitted by a light-emitting layer in each of the first pixel regions corresponding to the second pixel regions where the optical sensing components are positioned, and convert the optical signals into electrical signals, the electrical signals being used for adjusting signals input to each of the first electrodes in a corresponding first pixel region by pixel circuits in the corresponding first pixel region, a switch circuit in each of the second pixel regions; and a control circuit;

wherein, for each of the second pixel regions, a switch circuit in the second pixel region being configured to control whether an electrical signal from an optical sensing component in the second pixel region is input to the control circuit, the control circuit being configured to adjust a drive signal input to a pixel circuit in the first pixel region based on the electrical signal, the drive signal being used for the pixel circuit in the first pixel region to adjust a signal input to a first electrode in the first pixel region.

2. The display panel according to claim 1, wherein the first pixel region comprises a display area and a non-display area, an orthographic projection of the display area on the second base substrate covering an orthographic projection of the optical sensing component on the second base substrate.

3. The display panel according to claim 2, wherein the display cover further comprises: a switch circuit in each of the second pixel regions, and a control circuit, for each of the second pixel regions, a switch circuit in the second pixel region being configured to control whether an electrical signal from an optical sensing component in the second pixel region is input to the control circuit, the control circuit being configured to adjust a drive signal input to a pixel circuit in the first pixel region based on the electrical signal, the drive signal being used for the pixel circuit in the first pixel region to adjust a signal input to a first electrode in the first pixel region.

4. The display panel according to claim 3, wherein the display cover further comprises a black matrix configured to block light emitted from the light-emitting layer from exiting the display cover, and the first electrode layer is a transparent electrode layer.

5. The display panel according to claim 2, wherein the display cover further comprises a black matrix configured to block light emitted from the light-emitting layer from exiting the display cover, and the first electrode layer is a transparent electrode layer.

6. The display panel according to claim 1, wherein the display cover further comprises: a first planarization layer provided on a side of the optical sensing components away from the second base substrate, an orthographic projection of the first planarization layer on the second base substrate covering an orthographic projection of the switch circuit on the second base substrate, and the orthographic projection of the first planarization layer on the second base substrate covering an orthographic projection of the optical sensing component on the second base substrate.

7. The display panel according to claim 1, wherein the display cover further comprises a black matrix configured to block light emitted from the light-emitting layer from exiting the display cover, and the first electrode layer is a transparent electrode layer.

8. The display panel according to claim 7, wherein the black matrix is provided on a side of the optical sensing components near the second base substrate.

9. The display panel according to claim 7, wherein the black matrix is provided on the side of the optical sensing components away from the second base substrate, and an orthographic projection of the black matrix on the second base substrate does not overlap with the orthographic projection of the optical sensing components on the second base substrate.

10. The display panel according to claim 1, wherein the display cover further comprises a black matrix configured to block light emitted from the light-emitting layer from exiting the display cover, and the first electrode layer is a transparent electrode layer.

11. A method of manufacturing a display panel, comprising:

providing a first base substrate;

determining positions of a plurality of first pixel regions for forming an array arrangement on the first base substrate;

forming a pixel circuit layer on the first base substrate, the pixel circuit layer comprising a plurality of pixel circuits, and the plurality of pixel circuits being correspondingly arranged in the plurality of first pixel regions one to one;

sequentially forming a first electrode layer, a light-emitting layer and a second transparent electrode layer on the first base substrate formed with the pixel circuit layer, the first electrode layer comprising a first electrode located in each of the first pixel regions, and a pixel circuit in each first pixel region providing a signal to the first electrode in the each of the first pixel region;

providing a second base substrate;

determining positions of a plurality of second pixel regions for forming an array arrangement on the second base substrate;

forming a plurality of optical sensing components on the second base substrate, the plurality of optical sensing components being correspondingly arranged in the plurality of second pixel regions one to one; and cell-assembling the second base substrate formed with the optical sensing components with the first base substrate formed with the second transparent electrode layer so that the plurality of first pixel regions on the first base substrate correspond to the plurality of second pixel regions on the second base substrate one to one;

wherein the optical sensing components receive optical signals emitted by a light-emitting layer in each of the first pixel regions corresponding to the second pixel regions where the optical sensing components are positioned, and convert the optical signals into electrical signals, the electrical signals being used for adjusting signals input to each of the first electrodes in a corresponding first pixel region by pixel circuits in the corresponding first pixel region;

before forming of the plurality of optical sensing components on the second base substrate, forming a switch circuit layer on the second base substrate, wherein the switch circuit layer comprises a plurality of switch circuits, the plurality of switch circuits are arranged in the plurality of second pixel regions in one to one correspondence, for each of the second pixel regions, a switch circuit in the second pixel region controlling whether an electrical signal from an optical sensing component in the second pixel region is input to the control circuit, the control circuit adjusting a drive signal input to a pixel circuit in the first pixel region based on the electrical signal, the drive signal being used for the pixel circuit in the first pixel region to adjust a signal input to a first electrode in the first pixel region;

wherein forming of the plurality of optical sensing components on the second base substrate comprises: forming the optical sensing components on the second base substrate formed with the switching circuit layer.

12. The method according to claim 11, further comprising:

before forming of the plurality of optical sensing components on the second base substrate, forming a black matrix on the second base substrate;

forming of the plurality of optical sensing components on the second base substrate comprises: forming the optical sensing component on the second base substrate formed with black matrix.

13. The method according to claim 11, further comprising:
after forming of the plurality of optical sensing components on the second base substrate, forming a black matrix on the second base substrate formed with the optical sensing components, and an orthographic projection of the black matrix on the second base substrate does not overlap with the orthographic projection of the optical sensing components on the second base substrate.

14. The method according to claim 11, further comprising, before forming of the plurality of optical sensing components on the second base substrate,
forming a black matrix on the second base substrate;
forming of the plurality of optical sensing components on the second base substrate comprises: forming the optical sensing component on the second base substrate formed with black matrix.

15. The method according to claim 11, further comprising, after forming of the plurality of optical sensing components on the second base substrate, forming a black matrix on the second base substrate formed with the optical sensing components, and an orthographic projection of the black matrix on the second base substrate does not overlap with the orthographic projection of the optical sensing components on the second base substrate.

16. A display device, comprising a display panel, wherein the display panel comprises:
a display backplane and a display cover assembled to be a cell, wherein the display backplane comprises a plurality of first pixel regions in an array, and the display cover comprises a plurality of second pixel regions in an array, positions of the plurality of first pixel regions being correspond to positions of the plurality of second pixel regions one to one;
the display backplane further comprises a first base substrate, and a pixel circuit layer, a first electrode layer, a light-emitting layer and a second transparent electrode layer stacked on the first base substrate, wherein the pixel circuit layer comprises a plurality of pixel circuits, the first electrode layer comprises a plurality of first electrodes, the plurality of first electrodes and the plurality of pixel circuits being respectively provided in the plurality of first pixel regions in one to one correspondence, and each of the pixel circuits in the first pixel regions being configured to provide signals to the first electrodes in the first pixel regions; and
the display cover further comprises:
a second base substrate;
a plurality of optical sensing components on the second base substrate, wherein the plurality of optical sensing components are provided in the plurality of second pixel regions in one to one correspondence, and the optical sensing components being configured to receive optical signals emitted by a light-emitting layer in each of the first pixel regions corresponding to the second pixel regions where the optical sensing components are positioned, and convert the optical signals into electrical signals, the electrical signals being used for adjusting signals input to each of the first electrodes in a corresponding first pixel region by pixel circuits in the corresponding first pixel region,
a switch circuit in each of the second pixel regions; and
a control circuit;
wherein, for each of the second pixel regions, a switch circuit in the second pixel region being configured to control whether an electrical signal from an optical sensing component in the second pixel region is input to the control circuit, the control circuit being configured to adjust a drive signal input to a pixel circuit in the first pixel region based on the electrical signal, the drive signal being used for the pixel circuit in the first pixel region to adjust a signal input to a first electrode in the first pixel region.

17. The display device according to claim 16, wherein the display cover further comprises: a first planarization layer provided on a side of the optical sensing components away from the second base substrate, an orthographic projection of the first planarization layer on the second base substrate covering an orthographic projection of the switch circuit on the second base substrate, and the orthographic projection of the first planarization layer on the second base substrate covering an orthographic projection of the optical sensing component on the second base substrate.

18. The display device according to claim 16, wherein the display cover further comprises a black matrix configured to block light emitted from the light-emitting layer from exiting the display cover, and the first electrode layer is a transparent electrode layer.

19. The display device according to claim 18, wherein the black matrix is provided on a side of the optical sensing components near the second base substrate.

20. The display device according to claim 18, wherein the black matrix is provided on the side of the optical sensing components away from the second base substrate, and an orthographic projection of the black matrix on the second base substrate does not overlap with the orthographic projection of the optical sensing components on the second base substrate.

* * * * *